United States Patent [19]
Walsh et al.

[11] Patent Number: 5,567,975
[45] Date of Patent: Oct. 22, 1996

[54] GROUP II-VI RADIATION DETECTOR FOR SIMULTANEOUS VISIBLE AND IR DETECTION

[75] Inventors: Devin T. Walsh; Michael Ray, both of Goleta, Calif.

[73] Assignee: Santa Barbara Research Center, Goleta, Calif.

[21] Appl. No.: 269,819

[22] Filed: Jun. 30, 1994

[51] Int. Cl.⁶ ................ H01L 31/0256; H01L 31/0296; H01L 29/22

[52] U.S. Cl. .......................... 257/442; 257/78; 257/440; 257/461

[58] Field of Search ............................... 257/12, 78, 80, 257/82, 84, 85, 183, 184, 185, 188, 191, 196, 428, 431, 440, 441, 442, 443, 461, 463

[56] References Cited

U.S. PATENT DOCUMENTS

| | | | |
|---|---|---|---|
| 4,753,684 | 6/1988 | Ondris et al. | 136/258 |
| 4,847,489 | 7/1989 | Dietrich | 250/226 |
| 5,045,897 | 9/1991 | Ahlgren | 257/94 |
| 5,113,076 | 5/1992 | Schulte | 250/370.06 |
| 5,149,956 | 9/1992 | Norton | 250/211 J |
| 5,300,777 | 4/1994 | Goodwin | 257/442 |
| 5,373,182 | 12/1994 | Norton | 257/442 |

FOREIGN PATENT DOCUMENTS

| | | | |
|---|---|---|---|
| 55-101832 | 8/1980 | Japan . | |
| 2-119273 | 5/1990 | Japan | 257/440 |
| 2247985 | 3/1992 | United Kingdom | 257/443 |
| 2255227 | 10/1992 | United Kingdom . | |

OTHER PUBLICATIONS

T. Tung, M. H. Kalisher, A. P. Stevens and P. E. Herning, in: Materials for Infrared Detectors and Sources, Mater. Res. Soc. Symp. Proc., vol. 90 (Mater. Res. Soc., Pittsburgh, PA 1987) p. 321.

T. Tung, Infinite-Melt Vertical Liquid-Phase Expitaxy of HgCdTe from Hg Solution: Status and Prospects, J. Crystal Growth 86 (1988) pp. 161–172.

J. M. Arias, et al., "HgCdTe dual-band Infrared photodiodes grown by molecular beam epitaxy", J. Appl. Phys. 70 (8) 15 Oct. 1991.

J. M. Pawlikowski and P. Becla, "Some Properties of Photovoltaic $Cd_xHq_{1-x}Te$ Detectors For Infrared Radiation*", pp. 331–337, Institute of Physics, Technical University, 50–370 Wroclaw Wybzeize Wyspianskiego 27 Poland.

IBM Technical Disclosure Bulletin, Difderential Photoransducer, J. M. Woodall and D. Shang, vol. 12 No. 9 Feb. 1970, p. 1486.

Primary Examiner—Sara W. Crane
Assistant Examiner—Alice W. Tang
Attorney, Agent, or Firm—W. C. Schubert; W. K. Denson-Low

[57] ABSTRACT

A photovoltaic diode unit cell (10) includes a first layer (14) having a first type of electrical conductivity and a second layer (16) of Group II–VI material having a second type of electrical conductivity that differs from the first type. The first layer and the second layer are coupled together so as to form a photovoltaic junction (15) therebetween. The photovoltaic junction is coupled via electrical interconnects (18, 20, 22) to a readout 24 and collects first charge carriers resulting from an absorption of IR radiation within the layer 14. The junction also collects second charge carriers resulting from the absorption of visible light in a region of highly graded crystal potential formed, in a Liquid Phase Epitaxy (LPE)-grown embodiment of this invention, at an interface of a substrate and the first layer. The substrate is subsequently removed, preferably by a mechanical operation followed by a wet chemical etch, to expose the region of highly graded crystal potential.

5 Claims, 1 Drawing Sheet

GROUP II-VI RADIATION DETECTOR FOR SIMULTANEOUS VISIBLE AND IR DETECTION

FIELD OF THE INVENTION

This invention relates generally to detectors of electromagnetic radiation and, in particular, to detectors that are simultaneously responsive to electromagnetic radiation within two distinct bands of wavelengths.

BACKGROUND OF THE INVENTION

All conventional radiation detectors that are known to the inventors to be simultaneously responsive to both long wavelength infrared (LWIR) radiation and to visible radiation employ two separate detectors per detector unit (unit cell). One problem that arises from this approach is an increased fabrication complexity, detector complexity, readout complexity, interface requirement and cost. This problem is especially onerous when it is desired to provide a compact array comprised of a plurality of detector pixels or unit cells. Furthermore, it may be important that each detector unit cell or pixel be aligned or juxtaposed one with another so that there be a minimal offset between the detected IR radiation that arrives from a scene that is viewed by the array and the detected visible radiation that arrives from the same scene.

All known types of simultaneous LWIR/visible detectors that are known to the inventors do not adequately address these concerns.

Other types of dual spectral band responsive radiation detectors are known in the art, in particular detectors that are responsive to two IR radiation spectral bands.

By example, commonly assigned U.S. Pat. No. 5,113,076, "Two Terminal Multi-band Infrared Radiation Detector" to E. F. Schulte, discloses a radiation detector having two heterojunctions that function in a manner analogous to two back-to-back photodiodes. Each of the photodiodes is responsive to radiation within a different IR spectral band, such as Long Wavelength IR (LWIR) and Medium Wavelength IR (MWIR).

Also by example, commonly assigned U.S. Pat. No. 5,149,956, "Two-Color Radiation Detector Array and Methods of Fabricating Same", by P. R. Norton, teaches an array of three layer n-p-n or p-n-p photodetector structures in which a middle, electrically common layer is electrically and physically continuous across the array. The top and bottom layers are sensitive to different spectral bands, and each unit cell has two top side electrical contact structures for interfacing these layers to a readout circuit. A common contact provides a connection to the middle layer.

In general, the construction of an IR/visible detector presents a different set of problems than the construction of an IR/IR detector. This is true at least for the reason that the Group II-VI material from which these detectors are fabricated is more amenable to detecting the longer wavelength infrared radiation than the shorter wavelength visible radiation.

It is thus an object of this invention to provide a relatively simple and low cost method to fabricate an array of radiation detectors that are simultaneously responsive to both IR radiation and visible radiation.

It is another object of this invention to provide an array of radiation detectors that are simultaneously responsive to both IR radiation and visible radiation.

SUMMARY OF THE INVENTION

The foregoing and other problems are overcome and the objects of the invention are realized by a radiation detector having a radiation receiving surface, the radiation detector including a unit cell containing a first layer of Group II-VI material. A first portion of the first layer is responsive to first electromagnetic radiation entering through the surface, the first electromagnetic radiation having wavelengths within the IR region of the spectrum, for absorbing the first radiation for generating first detectable charge carriers therefrom. A second portion of the first layer is responsive to second electromagnetic radiation entering through the surface, and having wavelengths within the visible region of the spectrum, for absorbing the second radiation for generating detectable second charge carriers therefrom.

Further in accordance with this invention a photovoltaic diode unit cell includes a first layer of Group II-VI material having a first type of electrical conductivity and a second layer of Group II-VI material having a second type of electrical conductivity that differs from the first type. The first layer and the second layer are coupled together so as to form a photovoltaic junction therebetween. The photovoltaic junction is coupled via electrical interconnects to a readout and collects first charge carriers resulting from an absorption of IR radiation within the layer. The junction also collects second charge carriers resulting from the absorption of visible light in a region of highly graded crystal potential formed, in a Liquid Phase Epitaxy (LPE)-grown embodiment of this invention, at an interface of a substrate and the first layer. The substrate is subsequently removed, preferably by a mechanical operation followed by a wet chemical etch, to expose the region of highly graded crystal potential.

This invention also teaches a method of fabricating an array of radiation detector unit cells each of which is simultaneously responsive to IR radiation and to visible radiation.

A first step of the method provides an array of IR radiation responsive detector unit cells, the array comprising a substrate upon which is disposed an IR radiation responsive layer of semiconductor material. The array includes a highly graded crystal potential region between the substrate and the IR radiation responsive layer.

A next step of the method couples the array to an array of readout circuits to form a readout/detector assembly.

A next step of the method removes substantially all of the substrate so as to form a radiation receiving surface that is adjacent to the highly graded crystal potential region.

During use, visible radiation that is incident upon the radiation receiving surface is absorbed within the highly graded crystal potential region and generates detectable photocarriers therein. Simultaneously, IR radiation passes through the region and is absorbed within the IR radiation responsive layer of semiconductor material.

The step of removing the substrate includes the steps of (a) mechanically removing a portion of the substrate, such as by diamond point turning the substrate; and chemically removing, such as by etching, a remainder of the substrate. Preferably, the etchant is selected to stop its activity when the highly graded crystal potential region is exposed.

In a presently preferred embodiment of this invention the first layer is comprised of $Hg_{(1-x)}Cd_xTe$, wherein x is selected in accordance with a desired band of infrared radiation wavelengths to be detected, and the highly graded crystal potential region is comprised of $Hg_{(1-x)}Cd_xTe$ having a value of x that is greater than the value of x in the first layer.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1:
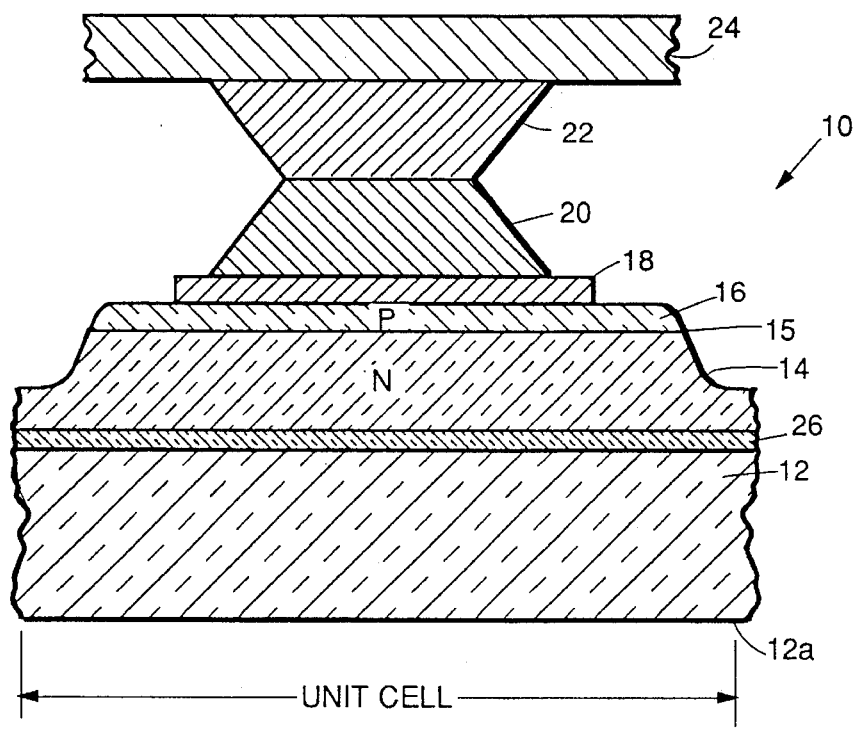
FIG. 1 is an enlarged cross-sectional view, not to scale, that illustrates a portion of an array of radiation detectors at an intermediate step in the fabrication process taught by this invention.

FIG. 1 illustrates a single pixel, or unit cell 10 that forms a portion of an array of IR radiation detectors constructed of Group II–VI material, specifically the material $Hg_{(1-x)}Cd_xTe$. The value of x is selected in accordance with well known criteria for absorbing a specific range of IR radiation wavelengths that are to be detected. More particularly, FIG. 1 illustrates the unit cell 10 at an intermediate step or stage of a fabrication method in accordance with this invention.

The unit cell 10 is comprised of a substrate 12, for example CdZnTe having a thickness of 0.03"–0.04", upon which is first grown or deposited an n-type conductivity $Hg_{(1-x)}Cd_xTe$ layer 14 followed by a p-type conductivity $Hg_{(1-x)}Cd_xTe$ layer 16. In a presently preferred embodiment of this invention the layers 14 and 16 are grown by Liquid Phase Epitaxy (LPE), although other techniques, such as Molecular Beam Epitaxy (MBE), can also be employed.

As an example, the unit cell 10 has dimensions of 50 micrometers by 50 micrometers. In practice, the substrate 12 is common to a plurality of such unit cells which are fabricated as a linear or as a two-dimensional array to form a dual wavelength band IR/visible imaging detector.

Suitable LPE growth techniques are described in, by example, the following two articles: T. Tung, M. H. Kalisher, A. P. Stevens and P. E. Herning, in: Materials for Infrared Detectors and Sources, Mater. Res. Soc. Symp. Proc., Vol. 90 (Mater. Res. Soc., Pittsburgh, Pa., 1987), p.321; and T. Tung, Infinite-Melt Vertical Liquid-Phase Epitaxy of HgCdTe from Hg Solution: Status and Prospects, J. Crystal Growth 86 (1988), pg. 161–172.

By example, the layer 14 is made n-type by being doped with indium at a concentration of $10^{15}$ atoms/cm$^3$, and the layer 16 is made p type by being doped with arsenic at a concentration of $10^{18}$ atoms/cm$^3$. The layer 14 has a thickness of approximately 15 micrometers and the layer 16 has a thickness of approximately 2 micrometers. In the illustrated embodiment the n and p layers are selectively etched to form a mesa structure that contains the p-n junction 15 that results at the interface of the n and p layers. Contact metal 18, such as aluminum, is formed on the p-type layer 16. An indium bump 20 is deposited on the contact metal 18 in a well known manner. The structure is then mated to a corresponding bump 22 on a readout integrated circuit 24 such that the resulting spacing between the detector array and the readout circuit is nominally 10 micrometers. The readout integrated circuit 24 may be comprised of silicon or may be a circuit board structure that is integrated to the detector unit cell 10. The specifics of the readout integrated circuit 24 are not germane to an understanding of this invention and are not discussed further in any significant detail.

A next step wicks an adhesive (not shown) into the region between the unit cell 10 and the readout integrated circuit 24 and the adhesive is then cured. Capillary action is sufficient to draw the adhesive into the assembly from an edge. The cured adhesive adds mechanical strength and rigidity the hybridized detector/readout assembly.

The process of growing the n-type layer 14 upon the substrate 12 by LPE results in the formation of a region 26 comprised of highly graded crystal potential. The presence of this region 26 is exploited by this invention to provide a visible radiation detector within the unit cell 10.

It should be realized that the unit cell 10 of FIG. 1 is a fully functional IR radiation detector, and could be employed in a backside illuminated configuration wherein incident IR radiation enters through-a bottom surface 12a of the substrate 12 and is absorbed within the n-type layer 14. Under the presence of a bias potential applied across the p-n junction 15, via the indium bumps 22 and 20 and a common contact (not shown), minority photogenerated charge carriers are collected by the junction 15 and are detected.

In accordance with this invention the unit cell 10 is further processed by a step of mechanically removing the bulk of the substrate 12, followed by a step of chemically removing the remainder of the substrate 12. The step of mechanically removing is preferably accomplished by diamond point turning from the backside surface 12a of the substrate 12 to remove the bulk of the substrate 12 down to a level approximately five micrometers to approximately 10 micrometers from the region 26. This step is facilitated by estimating the position of the region 26 from a measured hybrid squeeze, employing an IR microscope to determine the spacing between the opposing surfaces of the detector array and the readout circuit.

Figure 2:
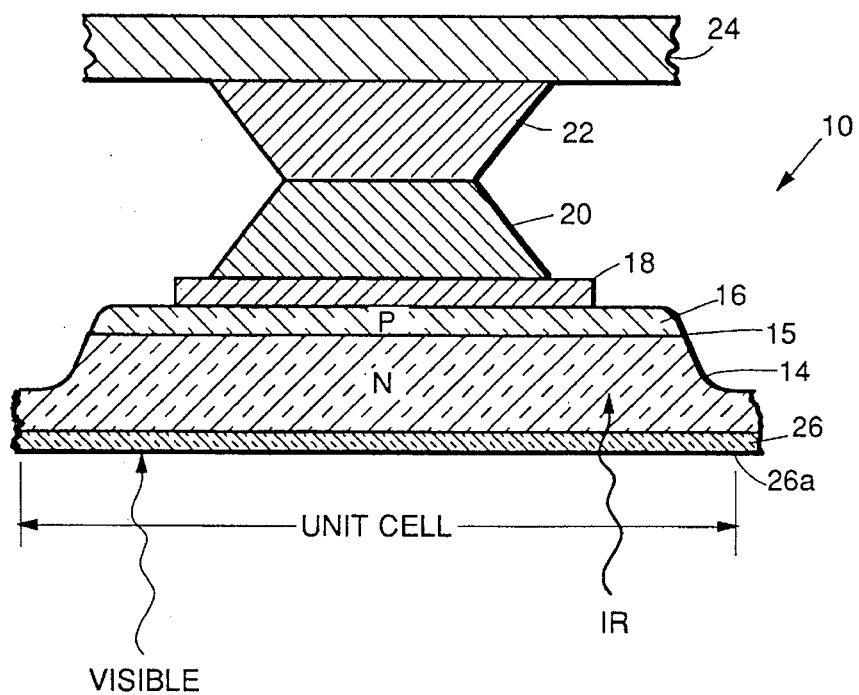
FIG. 2 is an enlarged cross-sectional view, not to scale, that illustrates the portion of the array of radiation detectors at the completion of the fabrication process.

Next, the remaining substrate material is removed with a wet chemical etch comprised of a solution of potassium dichromate, nitric acid, and $H_2O$. This particular etchant is selected because it removes the CdZnTe substrate material and then stops its activity within the region 26 where the value of x is equal to 0.6. That is, the presence of $Hg_{0.4}Cd_{0.6}Te$ within the region 26 serves as an etch stop to terminate the removal of the material. An antireflection coating (not shown) can be applied to the bottom, radiation receiving surface 26a. FIG. 2 illustrates the completed unit cell 10 at the termination of the fabrication process.

In accordance with this invention, the compositionally graded HgCdTe material of the region 26 is responsive to radiation within the range of wavelengths typically associated with visible light (approximately 770 nm to approximately 390 nanometers). The visually opaque CdZnTe substrate 12 is removed to expose the graded region 26, thereby enabling visible light to be absorbed and detected. In response to visible light that impinges on the surface 26a the region 26 generates minority charge carriers. Under the influence of the graded crystal potential these minority charge carriers are swept away before they can recombine. The charge carriers diffuse through the n-type layer 14, and are collected by the p-n junction 15 for detection by the readout integrated circuit 24. Simultaneous with the detection of the visible light, long wavelength IR (LWIR) radiation (approximately 10000 nm to approximately 14000 nanometers) that enters through the surface 26a passes through the region 26 and is absorbed within the n-type layer 14. As a result, the simultaneous detection of both visible radiation and IR radiation occurs.

Although described above in the context of an LPE grown structure, it should be realized that MBE can also be used, so long as the process is controlled so as to form the highly compositionally graded region 26. LPE is presently preferred over MBE because of the inherent high quality of the resulting layers, and because the highly graded region 26 is inherently formed during the LPE growth process due to a partial melting of the surface of the substrate 12 and a resulting interdiffusion with the material of the layer 14.

Furthermore, and although the unit cell 10 is illustrated as a mesa-type structure, it is within the scope of this invention to fabricate a planar photovoltaic device and to implant the doping impurities in a manner known in the art.

For an LWIR/visible detector the value of x in the layer 14 is approximately 0.2. It is also within the scope of the invention to fabricate a MWIR/visible detector or a SWIR/visible detector by setting the value of x in the layer 14 to be approximately 0.3 or approximately 0.4, respectively. As employed herein Short Wavelength Infrared (SWIR) radiation is considered to include a spectral region extending from approximately 1000 nm to approximately 3000 nm, and Medium Wavelength Infrared (MWIR) radiation is considered to include a spectral region extending from approximately 3000 nm to approximately 8000 nm.

Thus, while the invention has been particularly shown and described with respect to preferred embodiments thereof, it will be understood by those skilled in the art that changes in form and details may be made therein without departing from the scope and spirit of the invention.

What is claimed is:

1. A radiation detector for electromagnetic radiation having wavelengths within an IR radiation spectrum and within a visible radiation spectrum having a radiation receiving surface, comprising:

a unit cell comprised of a first layer of Group II–VI material that is compositionally differentiated into at least two regions; wherein a first region of said first layer is responsive to first electromagnetic radiation entering through said surface that has wavelengths within the IR radiation spectrum for absorbing the first electromagnetic radiation for generating first detectable charge carriers therefrom; and a second region of said first layer is comprised of highly compositionally graded Group II–VI material and is responsive to second electromagnetic radiation entering through said surface that the wavelengths within the visible radiation spectrum for absorbing the second electromagnetic radiation for generating second detectable charge carriers therefrom.

2. A radiation detector as set forth in claim 1 wherein said layer has a first type of electrical conductivity, wherein said detector is further comprised of a second layer of Group II–VI material having a second type of electrical conductivity that differs from the first type, wherein said second layer is coupled to at least one of said at least two regions so as to form a photovoltaic junction, and wherein said photovoltaic junction collects both said first charge carriers and also said second charge carriers.

3. A radiation detector assembly for electromagnetic radiation having wavelengths within an IR radiation spectrum and within a visible radiation spectrum comprising:

a first array comprised of a plurality of readout circuits;

a second array comprised of a plurality of radiation detector unit cells, said first array and said second array being hybridized together for coupling one of said readout circuits to one of said unit cells, said second array having a radiation receiving surface and further comprising, within each of said plurality of unit cells;

an n-type conductivity $Hg_{(1-x)}Cd_xTe$ layer and a p-type conductivity $Hg_{(1-x)}Cd_xTe$ layer forming a photovoltaic junction with said n-type layer, wherein a value of x in a first portion of said n-type layer is selected to make said first portion responsive to first electromagetic radiation entering through said surface and having wavelengths within the IR spectral region for absorbing the first radiation for generating first detectable charge carriers therefrom, wherein a value of x within a second portion of said n-type layer, not in contact with said p-type layer, makes said second portion responsive to second electromagnetic radiation entering through said surface and having wavelengths within the visible spectral region for absorbing the second radiation for generating detectable second charge carriers therefrom; and wherein said photovoltaic junction collects both said first charge carriers and also said second charge carriers from detection by said readout circuit.

4. A radiation detector assembly as set forth in claim 3 wherein said second portion of said n-type layer is a region of highly compositionally graded $Hg_{(1-x)}Cd_xTe$ that is disposed adjacent to said radiation receiving surface.

5. A radiation detector assembly as set forth in claim 3 wherein all of said p-type layer and at least some of said first portion of said n-type layer are contained within a mesa structure.

* * * * *